United States Patent [19]

Kwon

[11] Patent Number: 5,369,550
[45] Date of Patent: Nov. 29, 1994

[54] METHOD AND APPARATUS FOR COOLING A MOLDED-PLASTIC INTEGRATED-CIRCUIT PACKAGE

[75] Inventor: Young I. Kwon, San Jose, Calif.

[73] Assignee: VLSI Technology, Inc., San Jose, Calif.

[21] Appl. No.: 939,216

[22] Filed: Sep. 2, 1992

[51] Int. Cl.$^5$ .............................. H05K 7/20
[52] U.S. Cl. ..................... 361/690; 257/713; 257/721; 257/796; 361/707; 361/728; 361/813
[58] Field of Search ................. 361/382–389, 361/392, 394; 176/16.3, 52.4; 165/185, 80.2–80.4; 257/712, 713, 721, 787, 789–791, 795, 796, 675

[56] References Cited

U.S. PATENT DOCUMENTS

| | | | |
|---|---|---|---|
| 3,649,738 | 3/1972 | Andersson et al. | 174/16.3 |
| 4,393,437 | 7/1983 | Bell et al. | 361/383 |
| 4,493,145 | 1/1985 | Honda | 361/386 |
| 4,727,455 | 2/1988 | Neidig et al. | 361/385 |
| 4,734,315 | 3/1988 | Spence-Bate | 361/383 |
| 4,839,774 | 6/1989 | Hamburger | 361/383 |
| 5,105,259 | 4/1992 | McShane et al. | 357/72 |

FOREIGN PATENT DOCUMENTS 2202043  8/1990  Japan .................... 257/712

OTHER PUBLICATIONS

Johnson "Integrally Grooved Semiconductor Chip and Heat Sink" IBM Technical Disclosure Bulletin, vol. 14, No. 5, Oct. 1991, p. 1425.
Gupta et al, "Protection Device for Fluid–Cooled Electrical Apparatus", IBM Tech. Bulletin, vol. 26, No. 2, Jul. 1991, pp. 955–956.

Primary Examiner—Gregory D. Thompson
Attorney, Agent, or Firm—Patrick T. King

[57] ABSTRACT

Method and apparatus for improving the cooling of a molded package assembly for one or more integrated-circuit dies, each of which is attached to a die-attach paddle portion of a lead frame. The improved package includes a molded-plastic package body which is formed around the lead frame and the attached integrated-circuit die. The package body has one or more through-holes formed through it for passage of air, where the air currents are drawn by convection or forced through the through-hole for cooling the integrated-circuit die attached the die-attach paddle. The die-attach paddle has a corresponding hole formed in it and the through-hole formed in the package body is located adjacent to the hole in the die-attach paddle to form a through-channel through the lead frame and the molded plastic body for convection cooling. The die-attach paddle is covered with molded plastic material so that the die-attach paddle is not exposed in the through-channel. The through-hole formed in the molded-plastic body has inwardly projecting portions which form cooling fins. The lower surface of the package body is spaced apart from the ends of the external leads to provide a standoff space from which cooling air is drawn.

23 Claims, 3 Drawing Sheets

METHOD AND APPARATUS FOR COOLING A MOLDED-PLASTIC INTEGRATED-CIRCUIT PACKAGE

BACKGROUND OF THE INVENTION

1. Field of the Invention

This invention relates to packaging techniques for integrated circuits and more particularly to techniques for providing improved cooling for a molded plastic integrated-circuit package.

2. Prior Art

Conventional molded-plastic packages for integrated circuits are inexpensively fabricated. However, conventional molded-plastic packages have problems with high power densities due to their limited heat-dissipation capabilities. To overcome these problem, prior approaches have used various types of heat sinks and heat spreaders, which are difficult to manufacture. In addition, because of the dissimilarity in the temperature coefficients of expansion for the different packaging and heat sinking materials, these configurations have seals of questionable reliability between the body of the package and the heat sinks or heat spreader.

Consequently, the need still exists for a technique for increasing the thermal dissipation of a standard molded-plastic package for an integrated-circuit die without using a heat sink and while still maintaining good reliability for the package.

SUMMARY OF THE INVENTION

It is therefore an object of the invention to provide an economical, reliable technique for improving the thermal dissipation of a standard molded-plastic package for an integrated-circuit die.

In accordance with this and other objects of the invention, a molded-plastic package for an integrated-circuit die is provided which incorporates one or more through-holes in the package for increased convection cooling of the package. Convection air currents draw air through the through-holes to provide cooling for the integrated-circuit die. The lead frame includes external leads which extend downwardly from the molded plastic body so that the lower surface of the package body is spaced apart from the ends of the external leads. This provides a standoff space between the lower surface of the package body and the plane defined by the ends of the external leads so that air is drawn from the standoff space through the through-hole in the package body to cool the integrated-circuit die. A number of integrated-circuit dies can be mounted within a molded package body and a number of through-holes are formed through the package for passage of air to cool the integrated-circuit dies.

Apparatus according to the invention includes an integrated-circuit package assembly. The integrated-circuit package assembly includes a lead frame which has a die-attach paddle portion with an integrated-circuit die attached thereto. A molded package body for the package assembly is formed of a molded plastic material. The molded package body is formed around the lead frame and the attached integrated-circuit die. The package body has a through-hole formed there through for passage of air to cool the integrated-circuit die attached to the die-attach paddle. Air can pass through the through-hole by being forced or by convection.

The die-attach paddle has a hole formed in it which is aligned with the hole in the package to form a through-channel through the lead frame and the molded plastic body for passage of air so that air currents are drawn by convection through the through-hole in the package for cooling of the integrated-circuit die attached the die-attach paddle. The cross-sectional area extending through the molded package body can be greater than the cross-sectional area through the die-attach paddle so that the die-attach paddle is covered with molded plastic material and the die-attach paddle is not exposed in the through-channel. The through-hole formed in the molded-plastic body can have inwardly projecting portions which form cooling fins.

A method is provided for cooling an integrated-circuit die attached to a die-attach paddle of a lead frame around which is formed a molded package body. The method includes the step of drawing air through one or more through-channels formed by a hole formed through the die-attach paddle and by a through-hole formed through the molded package body, where the through-hole is aligned with the hole in the die-attach paddle to form the through-channel through the lead frame and the molded package body. The method includes drawing air from a space which is between the lower surface of the package body and the plane defined by the ends of the leads extending downwardly from the molded plastic body.

A method is provided for fabricating a molded-plastic package assembly for an integrated-circuit die. The method includes the steps of attaching an integrated-circuit die to a die attach paddle of a lead frame; molding a molded package body around the lead frame and the attached integrated-circuit die; and forming a through-hole in the molded package body for passage of air so that air currents can be drawn by convection through the through-hole in the package to cool the integrated-circuit die attached to the die-attach paddle. The method includes the step of forming projecting portions of the molded plastic body which project into the through-hole to provide cooling fins within the through-hole. The through-holes are formed in the molded package body projecting a pin from a mold for the molded package body.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
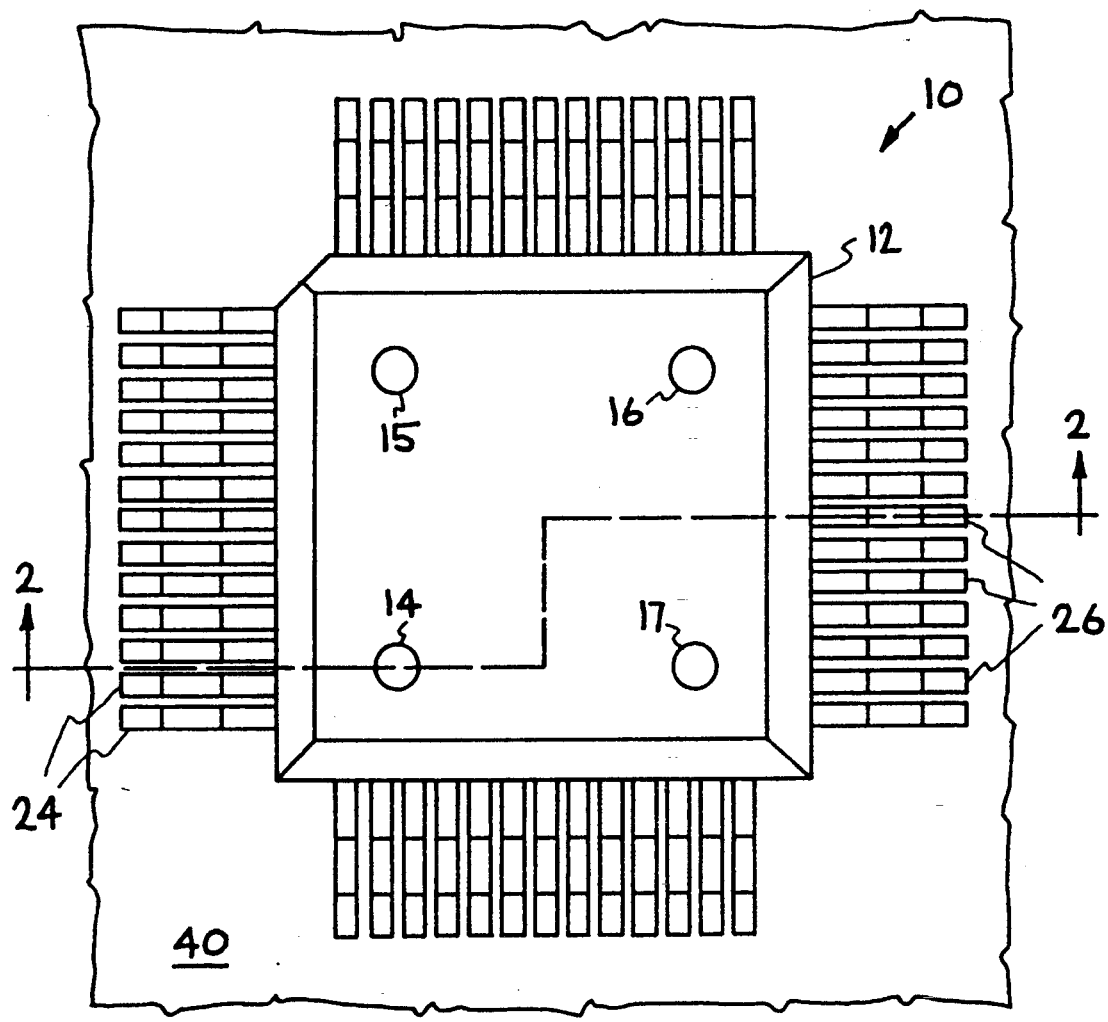
FIG. 1 is a plan view of a finished package assembly having through-holes formed therein for cooling of the package according to the invention.

FIGS. 1 illustrates a molded integrated-circuit package 10, according to the invention. The package includes a molded package body 12 formed of a conventional plastic molding material. The package body 12 is shown having a number of through-holes 14, 15, 16, 17 formed, for example, at each corner of the package body 12. The through-holes 14, 15, 16, 17 extend entirely through the package body 12 from top to bottom to provide passages for air to circulate through.

Figure 2:
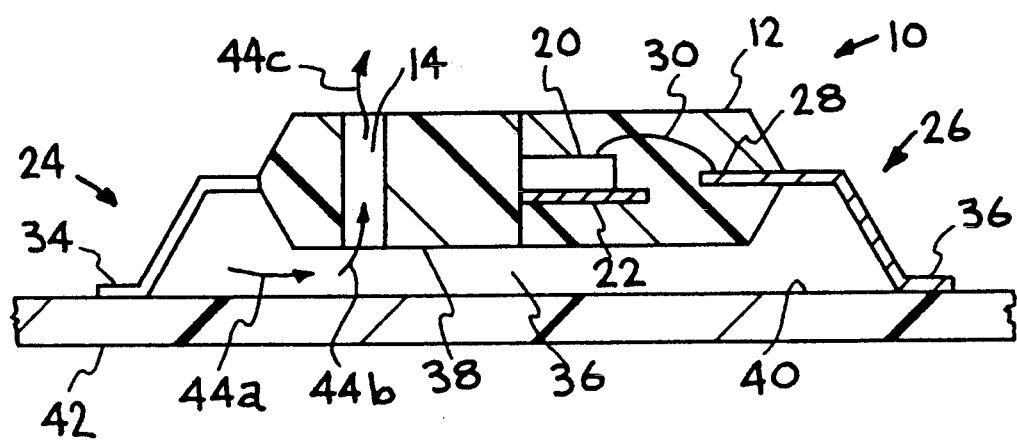
FIG. 2 is a section view, taken along section line 2—2 of FIG. 2 showing the structure and operation of the through-holes in the package.

FIG. 2 is a section view of the molded integrated-circuit package 10 shown in FIG. 1. An integrated-circuit die 20 is shown attached to a die-attach paddle portion 22 of a lead frame. The lead frame includes the centrally-located die-attach paddle portion 22 and a number of radially-extending conductive leads (typically shown as 24, 26). The inner ends of the lead 26 terminates in a bonding finger portion 28. One end of a typical bonding wire 30 is fixed to the bonding finger portion 28. The other end of the typical bonding wire 30 is bonded to a wirebonding pad on the integrated-circuit die 20, as illustrated in FIG. 2. A number of similar bonding wires connect similar bonding fingers to similar respective bonding pads on the integrated-circuit die 20.

The external leads (typically shown as 24, 26 in FIG. 2) extend downwardly from the molded plastic body so that the lower surface of the package body is spaced apart from the ends (typically shown as 34, 36) of the external leads to provide a space 36 between the lower surface 38 of the package body 12 and a plane defined by the ends of the external leads to standoff the package from a surface 40 of, for example, a circuit board 42. The space 36 permits air to be drawn by convection through the through-holes in the package body to cool the integrated-circuit die 20 attached the die-attach paddle 22. Alternatively air is drawn through the through-holes by being forced such as, for example, by a fan or the like. Air passes through the space 36 (as indicated by the flow line 44a), through-hole 14 (as indicated by the flow line 44b), and to the surrounding space (as indicated by the flow line 44c).

Figure 3:
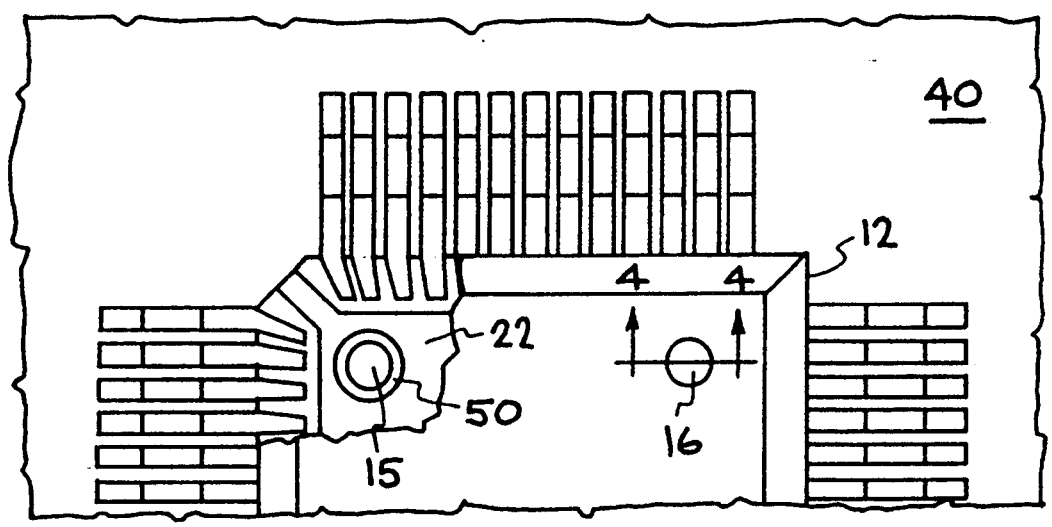
FIG. 3 is a partially cutaway, plan view of a package assembly showing a cooling through-hole formed in the die-attach portion of a lead frame.

FIG. 3 shows a cutaway view of a corner of the die-attach paddle 22 which has a hole 50 formed therein. The hole 15 is shown through tile lower portion of tile package body 12 to indicate that tile cross sectional area of tile hole 50 through the die-attach paddle is greater than the cross-sectional area of the hole 15. FIG. 2 shows that when the integrated-circuit die 20 is attached to the die-attach paddle 22, bonding wires 9 typically shown as 30 in FIG. 2) are attached between a bonding pad on the die and a bonding finger 28 of a lead. The bonding wires near the corners of the die-attach paddle are routed around the through-holes formed near the corners of the die-attach paddle.

Figure 4:
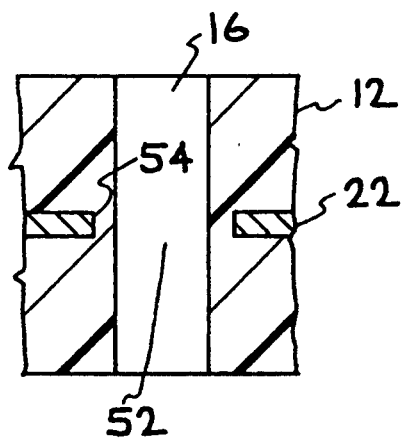
FIG. 4 is an enlarged, sectional view, taken along section line 4—4 of FIG. 3 of the region adjacent.

FIG. 4 illustrates in cross section the relationship between a typical through-hole 16 extending through the molded package body 12 and a hole 52 formed in another corner of the die-attach paddle 22. The hole 52 has a cross-sectional area greater than the cross-sectional area of the hole formed 16 through the die-attach paddle 22. FIG. 4 shows that the die-attach paddle is covered with the molded-plastic material of the package body 12 so that .the interior surface 54 of the metallic die-attach paddle 22 is not exposed to corrosive substances passing through the through-hole 16. The die-attach paddle 22 conducts heat from the integrated-circuit die 20 to the through-holes 14, 15, 16, 17.

Figure 5:
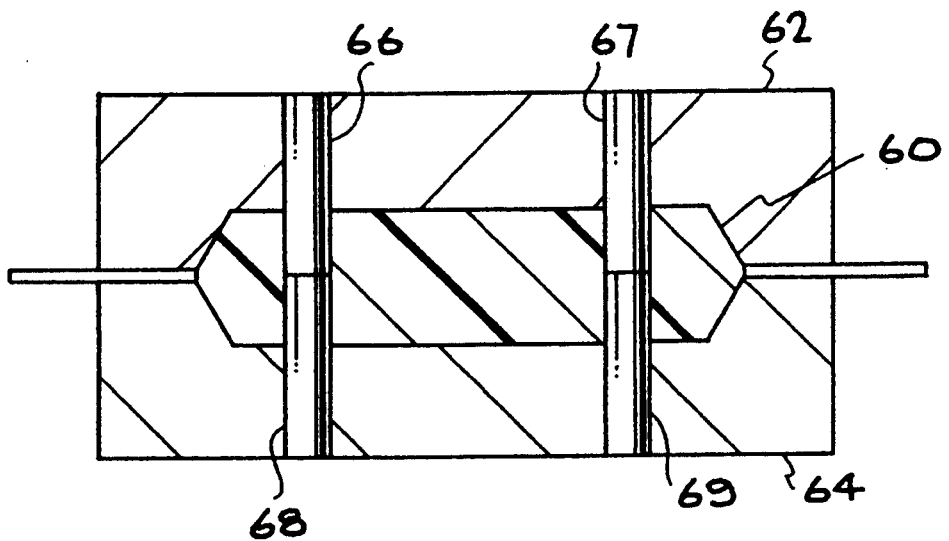
FIG. 5 is a sectional view showing the two mold halves for a package mold showing pins for forming the through holes in the package, according to the invention.

FIG. 5 illustrates in cross section a molded-plastic package assembly 60 formed between a top mold half 62 and a bottom mold half 64 of a package mold. Pins 66, 67 project downwardly from the top half mold 62 to form the top part of the through-holes in the package through-hole in the molded package. Pins 68, 69 project upwardly from the bottom half mold 64 to form the bottom part of the through-holes in the molded package 62. The interior ends of the respective pairs of pins 66, 68 and 67, 69 meet along the part line, or clamping area, between the mold halves 62, 64. The through holes 15–17 are illustrated as having circular cross-sectional areas, which are formed, for example, using smooth-surfaced cylindrical pins 66–69.

Figure 6:
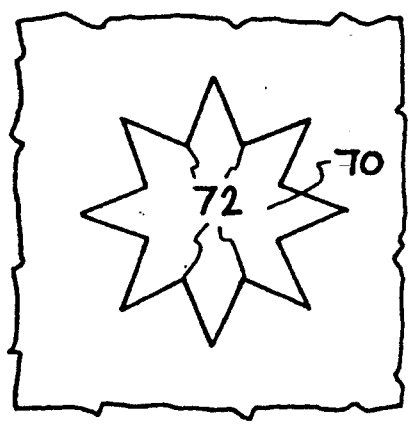
FIG. 6 is an enlarged plan view of alternative embodiment of a through-hole which has a cross section with inwardly projecting portions forming cooling fins.

FIG. 6 illustrates an alternative embodiment of a through-hole 70 which has inwardly projecting portions forming a series of cooling fins to increase the cooling surface area within the hole. To form this type of hole a slightly tapered projecting pin is extended from tile top and bottom mold halves, as described in connection with FIG. 5 above.

Figure 7:
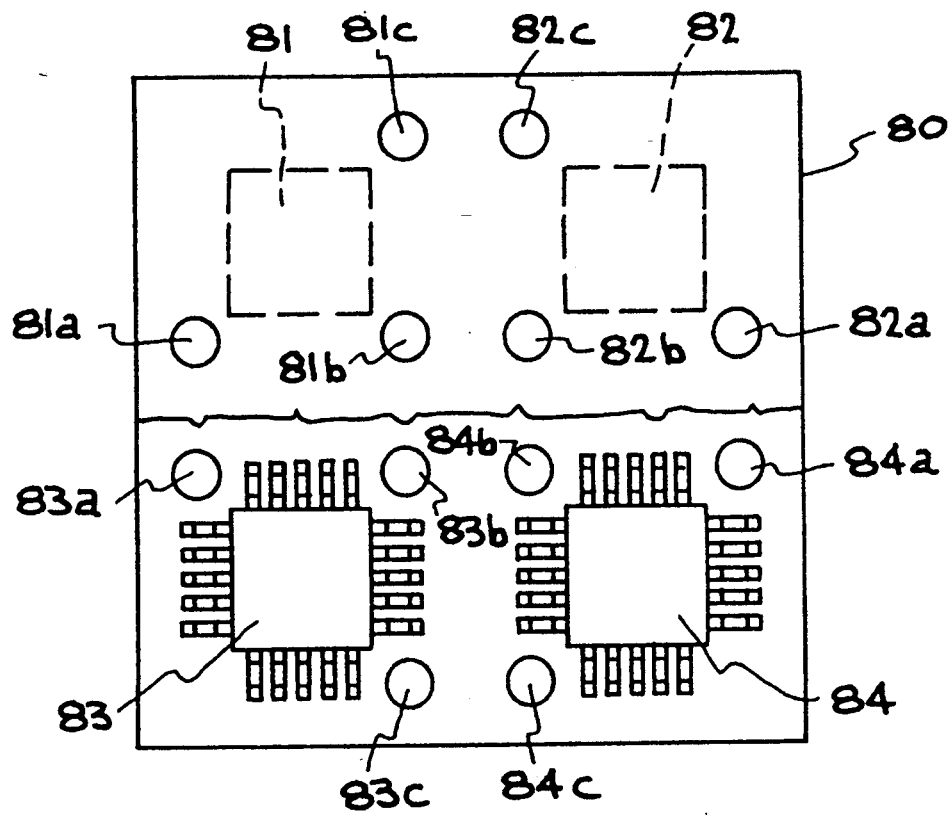
FIG. 7 is a partially cutaway, plan view showing a number of cooling through-holes in a multi-chip package assembly, according to the invention.

FIG. 7 illustrates an example of a multi-chip package assembly 80 having a number of cooling through-holes formed therein in the same manner as in the examples described herein above. In this example, four integrated-circuit dies 81, 82, 83, 84 are mounted in the package, as indicated in the FIG. 7. In a fashion similar to that shown in FIGS. 3 and 4 above through-holes 81a, 81b, and 81c are formed near the integrated-circuit die 81. Through-holes 82a, 82b, and 82c are formed near the integrated-circuit die 82. Through-holes 83a, 83b, and 83c are formed near the integrated-circuit die 83. Through-holes 84a, 84b, and 84c are formed near the integrated-circuit die 84.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the claims appended hereto and their equivalents.

I claim:

1. A method of cooling an integrated-circuit die attached to a die-attach paddle of a lead frame around which is formed a molded package body having a top and bottom surface, comprising the step of passing air through a through-channel formed by a hole formed extending from said top surface to said bottom surface of said molded package body, and extending through said die-attach paddle, said through-hole allowing passage of a current of cooling air so that said air current passing through said through-hole in said package cools said integrated-circuit die.

2. The method of claim 1 wherein the step of passing air through said through-channel formed by said hole formed extending from said top surface to said bottom surface of said molded package body, and extending through said die-attach paddle includes passing said current of cooling air over projecting portions of said molded plastic body which project into said through-hole to provide cooling fins within said through-hole.

3. The method of claim 1 including passing cooling air through said through-hole by convection.

4. The method of claim 1 including the step of passing air from a space located between said bottom surface of said package body and a plane defined by the ends of the leads extending downwardly from said molded plastic body, and through said through-channel through said lead frame and said molded plastic body to cool said integrated-circuit die.

5. The method of claim 1 including the additional step of passing air through said molded package body having a plurality of through-holes formed there through for passage of said air so that air currents are drawn by convection through said through-holes in said package for cooling of a plurality of integrated-circuit dies attached to respective die-attach paddle portions of said lead frame.

6. A molded plastic package assembly for an integrated circuit, comprising:
   a lead frame having a die-attach paddle with an integrated-circuit die attached thereto, said die-attach paddle having a hole formed there through
   a molded package body formed of a molded plastic material, said molded package body being formed around the lead frame and the attached integrated-circuit die and having a top and bottom surface, said package body having a through-hole formed there through, said through-hole extending from said top surface to said bottom surface of said molded package body, said through-hole formed in said package body aligned with said hole in said die-attach paddle to form a through-channel through said lead frame and said molded package body for passage of air for cooling of said integrated-circuit die attached to said die-attach paddle.

7. A molded plastic package assembly for an integrated circuit, comprising:
   a lead frame having a die-attach paddle with an integrated-circuit die attached thereto, said die-attach paddle having a hole formed there through
   a molded package body formed of a molded plastic material, said molded package body being formed around the lead frame and the attached integrated-circuit die and having a top and bottom surface, said package body having a through-hole formed there through, said through-hole extending from said top surface to said bottom surface of said molded package body, said through-hole formed in said package body aligned with said hole in said die attach paddle to form a through-channel through said lead frame and said molded package body for passage of air for cooling of said integrated-circuit die attached to said die-attach paddle, said through-hole having a cross-sectional area less than the cross-sectional area of said hole formed through said die-attach paddle so that said die-attach paddle is covered with molded plastic material and said die attach paddle is not exposed in said through-channel.

8. A molded plastic package assembly for an integrated circuit, comprising:
   a lead frame having a die-attach paddle with an integrated-circuit die attached thereto, said die-attach paddle having a hole formed there through
   a molded package body formed of a molded plastic material, said molded package body being formed around the lead frame and the attached integrated-circuit die and having a top and bottom surface, said package body having a through-hole formed there through, said through-hole extending from said top surface to said bottom surface of said molded package body, said through-hole formed in said package body aligned with said hole in said die-attach paddle to form a through-channel through said lead frame and said molded package body for passage of air for cooling of said integrated-circuit die attached to said die-attach paddle, said through-hole having inwardly projecting portions forming cooling fins.

9. A method of fabricating a molded-plastic package assembly for an integrated-circuit die, comprising the steps of:
   attaching an integrated-circuit die to a die attach paddle of a lead frame;
   molding a molded package body around the lead frame and the attached integrated-circuit die;
   forming a through-hole containing projecting portions in the molded package body, for passage of air so that air currents can be drawn through the through-hole in the package to cool the integrated-circuit die attached the die-attach paddle, by projecting a pin, which is shaped to form cooling fins within the through-hole, from a mold for the molded package body to form the through-hole in the molded package.

10. A molded plastic package assembly for an integrated circuit, comprising:
   a lead frame containing a die-attach paddle, said die attach paddle having a hole formed therethrough,
   an integrated-circuit die, said integrated-circuit die attached to said die-attach paddle said lead frame,
   a molded package body formed of a plastic material, said molded package body disposed encapsulating said integrated-circuit die, said die-attach paddle, and said lead frame, said molded package body having a top and bottom surface, said molded package body further having a through-hole formed extending from said top surface of said package, through said hole in said die-attach paddle, to said bottom surface of said package body, said through-hole disposed such that air passing through said through-hole cools said integrated-circuit die.

11. The molded plastic package assembly of claim 10 wherein said air passes through said through-hole by convection.

12. The molded plastic package assembly of claim 10 wherein said through-hole in said package body has a cross-sectional area less than the cross-sectional area of said hole formed through said die-attach paddle such that said die-attach paddle does not project into said through-hole formed through said package body, and such that said die-attach paddle is not exposed in said through-hole.

13. The package assembly of claim 10 wherein said through-hole formed in said molded package body has inwardly projecting portions forming cooling fins.

14. The package assembly of claim 10 wherein said lead frame includes external leads extending downwardly from said molded package body such that said bottom surface of said package body is spaced apart from the ends of said external leads to provide a stand-off space between said bottom surface of said package body and a plane defined by the ends of the external leads and so that air is drawn from said standoff space through said through-hole in said package body for cooling of said integrated-circuit die.

15. The molded-plastic package assembly of claim 10 wherein said lead frame has a plurality of die-attach paddle portions with a plurality of integrated-circuit dies, respective ones of which are attached to respective die-attach paddle portions and wherein said molded package body is formed around said lead frame and said attached integrated-circuit dies, said molded package body having a plurality of through-holes formed there through for passage of air so that air currents are drawn by convection through said through-holes in said package for cooling of said integrated-circuit dies.

16. A method for cooling an integrated-circuit die disposed within a molded plastic package assembly comprising the steps of:
forming a hole through a die-attach paddle portion of a lead frame,
attaching said integrated-circuit die to said die-attach paddle portion of said lead frame with said integrated circuit die disposed such that said integrated-circuit die does not overlie said hole formed through said die-attach paddle of said lead frame,
encapsulating said integrated-circuit die, said die-attach paddle, and said lead frame in a molded package body having a top and a bottom surface,
forming a through-hole from said top surface of said package, through said hole in said die-attach paddle, to said bottom surface of said package body,
passing air through said through-hole thereby allowing air to pass through said molded package and said die-attach paddle portion of said lead frame such that air flows proximate to said integrated-circuit die and cools said integrated-circuit die.

17. The method of claim 16 wherein said step of encapsulating said integrated-circuit die includes the step of surrounding said integrated-circuit die, said die-attach paddle, and said lead frame with a plastic material.

18. The method of claim 16 wherein said step of forming said through-hole includes the step of forming projecting portions of said molded plastic package within said through-hole such that cooling fins are provided within said through-hole.

19. The method of claim 18 wherein said step of passing air through said through-hole includes passing air over said cooling fins located within said through-hole formed through said molded plastic package.

20. The method of claim 16 wherein said step of passing air through said through-hole includes passing cooling air through said through-hole by convection.

21. The method of claim 16 including the step of passing air from a space located between said bottom surface of said package body and a plane defined by the ends of the leads extending downwardly from said molded plastic body, and through said through-channel through said lead frame and said molded plastic body to cool said integrated-circuit die.

22. The method of claim 16 including the additional step of passing air through said molded package body having a plurality of through-holes formed there through for passage of said air so that air currents are drawn by convection through said through-holes in said package for cooling of a plurality of integrated-circuit dies attached to respective die-attach paddle portions of said lead frame.

23. The method of claim 16 including the step of forming a plurality of through-holes from said top surface of said package, through said hole in said die-attach paddle, to said bottom surface of said package body for passage of air so that air currents can pass through said plurality of through-holes in said molded package to cool each one of a plurality of integrated-circuit dies attached to respective die-attach paddles formed in said lead frame.

* * * * *